(12) United States Patent
Al-Shyoukh et al.

(10) Patent No.: US 7,994,819 B2
(45) Date of Patent: Aug. 9, 2011

(54) LEVEL-SHIFTER CIRCUIT

(75) Inventors: Mohammad A. Al-Shyoukh, Richardson, TX (US); Ayman A. Fayed, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/346,200

(22) Filed: Dec. 30, 2008

(65) Prior Publication Data

US 2010/0117682 A1 May 13, 2010

Related U.S. Application Data

(60) Provisional application No. 61/028,077, filed on Feb. 12, 2008.

(51) Int. Cl.
*H03K 19/0175* (2006.01)
(52) U.S. Cl. .............................. 326/68; 326/81; 327/333
(58) Field of Classification Search .................. 330/51, 330/10, 251, 298; 326/63, 68, 81; 327/333
See application file for complete search history.

(56) References Cited

U.S. PATENT DOCUMENTS

| | | | | |
|---|---|---|---|---|
| 5,283,479 A | * | 2/1994 | Rosseel et al. | 326/104 |
| 5,973,368 A | * | 10/1999 | Pearce et al. | 257/368 |
| 6,229,389 B1 | * | 5/2001 | Pullen et al. | 330/10 |
| 6,232,833 B1 | * | 5/2001 | Pullen | 330/10 |
| 6,483,345 B1 | * | 11/2002 | Whittaker et al. | 326/62 |
| 6,603,291 B2 | * | 8/2003 | Wheeler et al. | 323/224 |
| 6,774,696 B2 | * | 8/2004 | Clark et al. | 327/333 |
| 7,026,855 B2 | * | 4/2006 | Sueoka et al. | 327/333 |
| 7,076,070 B2 | * | 7/2006 | Pearce et al. | 381/120 |
| 7,276,968 B2 | * | 10/2007 | Ozawa et al. | 330/251 |
| 7,439,801 B2 | * | 10/2008 | Higuchi et al. | 330/10 |
| 7,463,065 B1 | * | 12/2008 | Lin et al. | 326/68 |
| 7,495,509 B2 | * | 2/2009 | Wong et al. | 330/10 |
| 7,583,126 B2 | * | 9/2009 | Yang et al. | 327/333 |
| 2006/0012408 A1 | * | 1/2006 | Kushner | 327/112 |

* cited by examiner

*Primary Examiner* — Vibol Tan
(74) *Attorney, Agent, or Firm* — William B. Kempler; Wade J. Brady, III; Frederick J. Telecky, Jr.

(57) ABSTRACT

One embodiment of the invention includes a level-shifter circuit. The circuit comprises a control stage that steers a current from one of a first control node and a second control node to the other of the first control node and the second control node based on an input signal to set a first initial voltage at the first control node and a second initial voltage at the second control node, the input signal having logic-high and logic-low voltage magnitudes that occupy a low voltage domain. The circuit also includes a logic driver that is coupled to the second control node and is referenced in a high voltage domain. The logic driver can be configured to provide an output signal having logic-high and logic-low voltage magnitudes that occupy the high voltage domain based on the second initial voltage.

13 Claims, 5 Drawing Sheets

LEVEL-SHIFTER CIRCUIT

TECHNICAL FIELD

This invention relates to electronic circuits, and more specifically to a level-shifter circuit.

BACKGROUND

Half-bridge and full-bridge power stages are commonly employed as power delivery stages in applications where power conversion at high efficiencies is required. For example, half-bridge and full-bridge power stages can be employed in DC-DC power converters and class-D audio power amplifiers. In portable power integrated circuits (ICs), power conversion and power delivery to the load is required at exceptionally high efficiencies. As an example, limited battery power typically needs to be delivered to the load at minimal losses to prolong battery life.

In portable electronics applications, power management, audio, and digital circuitry can be integrated on one system-on-chip (SoC) die to create products with a small form factor. However, the integration of power applications on digital complementary metal-oxide semiconductor (CMOS) technologies presents numerous challenges. Digital CMOS process technologies are primarily optimized for switching speed along with maximizing the logic-gate count realizable within a given area.

As an example, a given transistor in such digital CMOS processes can have a feature size that can vary from 45 nm to 0.18 μm. A maximum gate-source breakdown voltage of the given transistor can thus vary from 1.0 volts to 1.8 volts. However, a battery voltage in portable devices can typically range from 2.3 volts to 5.5 volts, which is a voltage that is significantly larger than that which can be tolerated on the typical CMOS transistor devices. Thus, level-shifting circuitry can be implemented to control high and/or low-side power transistors in a half-bridge or full-bridge circuit, regardless of the maximum battery voltage and variations of the voltage of a given battery.

SUMMARY

One embodiment of the invention includes a level-shifter circuit. The circuit comprises a control stage that steers a current from one of a first control node and a second control node to the other of the first control node and the second control node based on an input signal to set a first initial voltage at the first control node and a second initial voltage at the second control node, the input signal having logic-high and logic-low voltage magnitudes that occupy a low voltage domain. The circuit also includes a logic driver that is coupled to the second control node and is referenced in a high voltage domain. The logic driver can be configured to provide an output signal having logic-high and logic-low voltage magnitudes that occupy the high voltage domain based on the second initial voltage.

Another embodiment of the invention includes a method for level-shifting an input signal that is in a low voltage domain to provide an output signal that is in a high voltage domain. The method comprises asserting the input signal from a logic-low state to a logic-high state and activating a first transistor in a control stage based on the input signal to conduct a current from a positive rail through the first transistor to set a first initial voltage at a first control node to which the first transistor is coupled. The method also comprises deactivating a second transistor in the control stage based on the input signal to halt the current from flowing through the second transistor to set a second initial voltage at a second control node to which the second transistor is coupled. The method further comprises generating the output signal via a logic driver that is referenced in the high voltage domain based on the second initial voltage at the second control node.

Another embodiment of the invention includes a high-side gate driver circuit. The high-side gate driver circuit comprises means for generating a voltage corresponding to a logic-low signal in a high voltage domain, the voltage having a magnitude that is less than a voltage magnitude of a logic-high signal in the high voltage domain by a maximum activation voltage of a high-side power transistor. The high-side gate driver circuit also comprises means for level-shifting an input signal from a low voltage domain to the high voltage domain. The means for level-shifting comprises means for steering a current from a positive rail through one of a first control node and a second control node based on the input signal. The means for level-shifting also comprises means for setting a first initial voltage at the first control node and for setting a second initial voltage at the second control node based on the current. Each of the first and second initial voltages can be between the logic-low signal and the logic-high signal in the high voltage domain. The means for level-shifting further comprises means for generating an output signal in the high voltage domain based on the second initial voltage at the second control node.

DETAILED DESCRIPTION

The invention relates to electronic circuits, and more specifically to a level-shifter circuit. The level-shifter circuit can be configured to level-shift an input signal from a low voltage domain to a high voltage domain. Thus, the level-shifter circuit can be implemented in a high-side gate driver circuit, which can be can be implemented in a power converter, such as a DC-DC power converter, or a class-D audio amplifier. The level-shifter circuit includes a control stage that is driven by the input signal and a complement of the input signal. The input signal controls a first transistor and the complement of the input signal controls a second transistor, such that the first and second transistors steer a current through one of the respective transistors in response to the input signal. The current sets an initial voltage at each of a first control node that is coupled to the first transistor and a second control node that is coupled to the second transistor.

The level-shifter circuit also includes a logic driver that is coupled to the second control node. The logic driver can be an inverter that is referenced in the high voltage domain, such that an output signal provided from the logic driver can have logic-high and logic-low states that occupy the high voltage domain and can be an opposite logic state of the input signal. Accordingly, a high-side power transistor can be activated in response to a logic-high state of the input signal based on the output signal having a logic-low state in the high voltage domain, which can be approximately equal to the positive rail voltage minus a desired gate-source activation voltage of the high-side power transistor.

The level-shifter circuit can further include a cross-coupled latch that can latch a voltage magnitude of the first and second control nodes in the high voltage domain based on the initial voltages. For example, the control node through which the current is steered can have a lower magnitude than the other control node. As a result, the cross-coupled latch can latch the control node through which the current is steered to a logic-low state in the high voltage domain and the other control node to a logic-high state in the high voltage domain, which can be approximately equal to a battery voltage.

Figure 1:
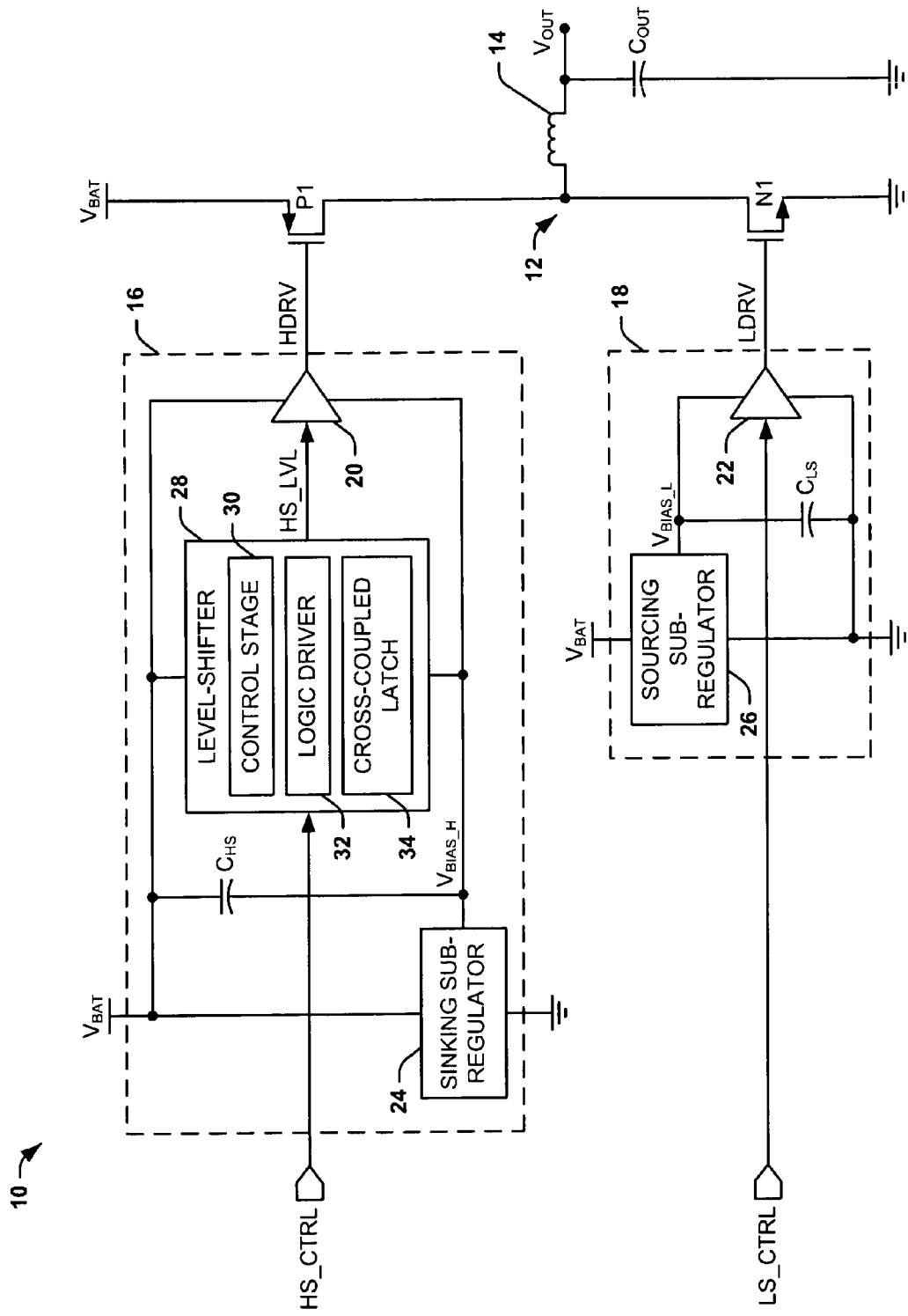
FIG. 1 illustrates an example of a power converter system in accordance with an aspect of the invention.

FIG. 1 illustrates an example of a power stage system 10 in accordance with an aspect of the invention. In the example of FIG. 1, the power stage system 10 can be a portion of a DC-DC power converter, such as a buck DC-DC power converter, that converts a positive rail voltage, demonstrated in the example of FIG. 1 as a battery voltage $V_{BAT}$, into an output voltage $V_{OUT}$. Specifically, the power stage system 10 includes a high-side power field effect transistor (FET) P1, demonstrated as a P-type FET, that is coupled between the battery voltage $V_{BAT}$ and a switching node 12. The power stage system 10 also includes a low-side power FET N1, demonstrated as an N-type FET, that is coupled between the switching node 12 and a negative rail voltage, demonstrated in the example of FIG. 1 as ground. The high and low-side power FETs P1 and N1 are periodically activated to provide a current flow through an inductor 14 to set the output voltage $V_{OUT}$ across a capacitor $C_{OUT}$ based on a switching duty-cycle of the high-side power FET P1 and the low-side power FET N1.

The power stage system 10 includes a high-side gate driver 16 and a low-side gate driver 18. The high-side gate driver 16 is configured to convert a high-side control signal HS_CTRL to a high-side switching signal HDRV via a driver 20 that controls the switching of the high-side power FET P1. Similarly, the low-side gate driver 18 is configured to convert a low-side control signal LS_CTRL to a low-side switching signal LDRV via a driver 22 that controls the switching of the low-side power FET N1. Each of the high-side control signal HS_CTRL and the low-side control signal LS_CTRL can be provided from a control system (not shown) that dictates the switching duty-cycle of the high-side power FET P1 and the low-side power FET N1. For example, the switching duty-cycle can be set by a feedback loop (not shown) based on the output voltage $V_{OUT}$.

Each of the high-side gate driver 16 and the low-side gate driver 18 are coupled between the battery voltage $V_{BAT}$ and ground. As an example, the battery voltage $V_{BAT}$ can have a magnitude that varies between 2.3 volts and 5.5 volts. However, the high-side power FET P1 and the low-side power FET N1 can have a maximum gate-source breakdown voltage that is significantly less than the battery voltage $V_{BAT}$. As a result, biasing the gate of the high and low-side power FETs P1 and N1 between the battery voltage $V_{BAT}$ and ground can damage the high and low-side power FETs P1 and N1.

The high-side gate driver 16 thus includes a sinking sub-regulator 24 that is configured to generate a high-side bias voltage $V_{BIAS\_H}$ that is separated from the battery voltage $V_{BAT}$ via a capacitor $C_{HS}$. The high-side bias voltage $V_{BIAS\_H}$ has a magnitude that is approximately equal to the battery voltage $V_{BAT}$ minus a voltage $V_{GS\_MAX}$ that can be a maximum desired gate-source activation voltage of the high-side power FET P1. The sinking sub-regulator 24 can also be configured as a power rail to rapidly drain a gate capacitance of the high-side power FET P1 to provide rapid activation of the high-side power FET P1. Likewise, the low-side gate driver 18 includes a sourcing sub-regulator 26 that is configured to generate a low-side bias voltage $V_{BIAS\_L}$ that is separated from ground via a capacitor $C_{LS}$. The low-side bias voltage $V_{BIAS\_L}$ has a magnitude that is approximately equal to a voltage $V_{GS\_MAX}$ that can be a maximum desired gate-source activation voltage of the low-side power FET N1. The sourcing sub-regulator 26 can also be configured as a power rail to rapidly charge a gate capacitance of the low-side power FET N1 to provide rapid activation of the low-side power FET N1.

Based on the sinking sub-regulator 24, the high-side power FET P1 is activated in a high voltage domain (i.e., between $V_{BAT}$ and $V_{BIAS\_H}$). Similarly, based on the sourcing sub-regulator 26, the low-side power FET N1 is activated in a low voltage domain (i.e., between ground and $V_{BIAS\_L}$). Therefore, the high and low-side power FETs P1 and N1 can be activated without damage resulting from too great a gate-source voltage $V_{GS}$. The high and low-side control signals HS_CTRL and LS_CTRL can each be provided by the control system in or substantially near the low voltage domain. Thus, the low-side control signal LS_CTRL can be merely provided to the driver 22 to activate the low-side power FET N1. However, the high-side control signal HS_CTRL cannot activate the high-side power FET P1 via the driver 20 directly.

To activate the high-side power FET P1, the high-side gate driver 16 includes a level-shifter circuit 28 that is configured to convert the high-side control signal HS_CTRL from the low voltage domain to the high voltage domain. Thus, the level-shifter circuit 28 generates a level-shifted control signal HS_LVL that is in the high voltage domain based on the high-side control signal HS_CTRL. The level-shifted control signal HS_LVL is provided to the driver 20 to generate the high-side switching signal HDRV, thus activating and deactivating the high-side power FET P1 based on the switching duty-cycle of the high-side control signal HS_CTRL.

The level-shifter circuit 28 includes a control stage 30, a logic driver 32, and a cross-coupled latch 34. The control stage 30 can be driven by the high-side control signal HS_CTRL and a complement of the high-side control signal HS_CTRL' (not shown). As an example, the high-side control signal HS_CTRL and the complement of the high-side control signal HS_CTRL' can control a pair of transistors to steer a current through one of the transistors. The current sets an initial voltage at each of a pair of respective control nodes that are coupled to the transistors. The initial voltages of each of the respective control nodes can be between the battery voltage $V_{BAT}$ and the high-side bias voltage $V_{BIAS\_H}$. The logic driver 32 can be coupled to one of the control nodes and can be referenced in the high voltage domain. As an example, the logic driver 32 can be an inverter. Thus, the logic driver 32 can provide the level-shifted control signal HS_LVL based on the initial voltage at the respective control node. The cross-coupled latch 34 interconnects the control nodes, and can thus latch the voltage magnitudes of the respective control nodes to one of the battery voltage $V_{BAT}$ or the high-side bias voltage $V_{BIAS\_H}$ based on the initial voltages.

The current that sets the initial voltages at the control nodes can flow substantially continuously from the battery voltage $V_{BAT}$, and the control stage 30 can steer the current to flow through a single transistor based on the activation and deactivation of the pair of transistors in the control stage 30. For example, the steered current can set the initial voltages across each of a pair of resistors that are each coupled to a respective one of the control nodes. Thus, the current can be steered rapidly to set the initial voltages of the respective control nodes. As a result, the level-shifted control signal HS_LVL can be provided rapidly, as opposed to being subject to substantial delays and variability that can result from discharging a gate of a cascoded transistor through a drain of a level-shifting bias transistor, such as in a typical cascaded level-shifting circuit. Therefore, the level-shifter circuit 28 can provide the level-shifted control signal HS_LVL accurately and without substantial delays and duty-cycle distortion.

It is to be understood that the power stage system 10 is not intended to be limited to the example of FIG. 1. For example, the high and low-side gate drivers 16 and 18 can be configured in different ways. As an example, based on the voltages of the logic states of the low-side control signal LS_CTRL and the level-shifted control signal HS_LVL, the drivers 20 and 22 could be omitted. As another example, the power stage system 10 is not limited to use in a buck DC-DC converter, but could be implemented in other types of power converters, as well. Furthermore, the power stage system 10 is not limited to receiving power from a battery, but could instead receive power from any DC power source. Accordingly, the power stage system 10 can be configured in any of a variety of ways.

Figure 2:
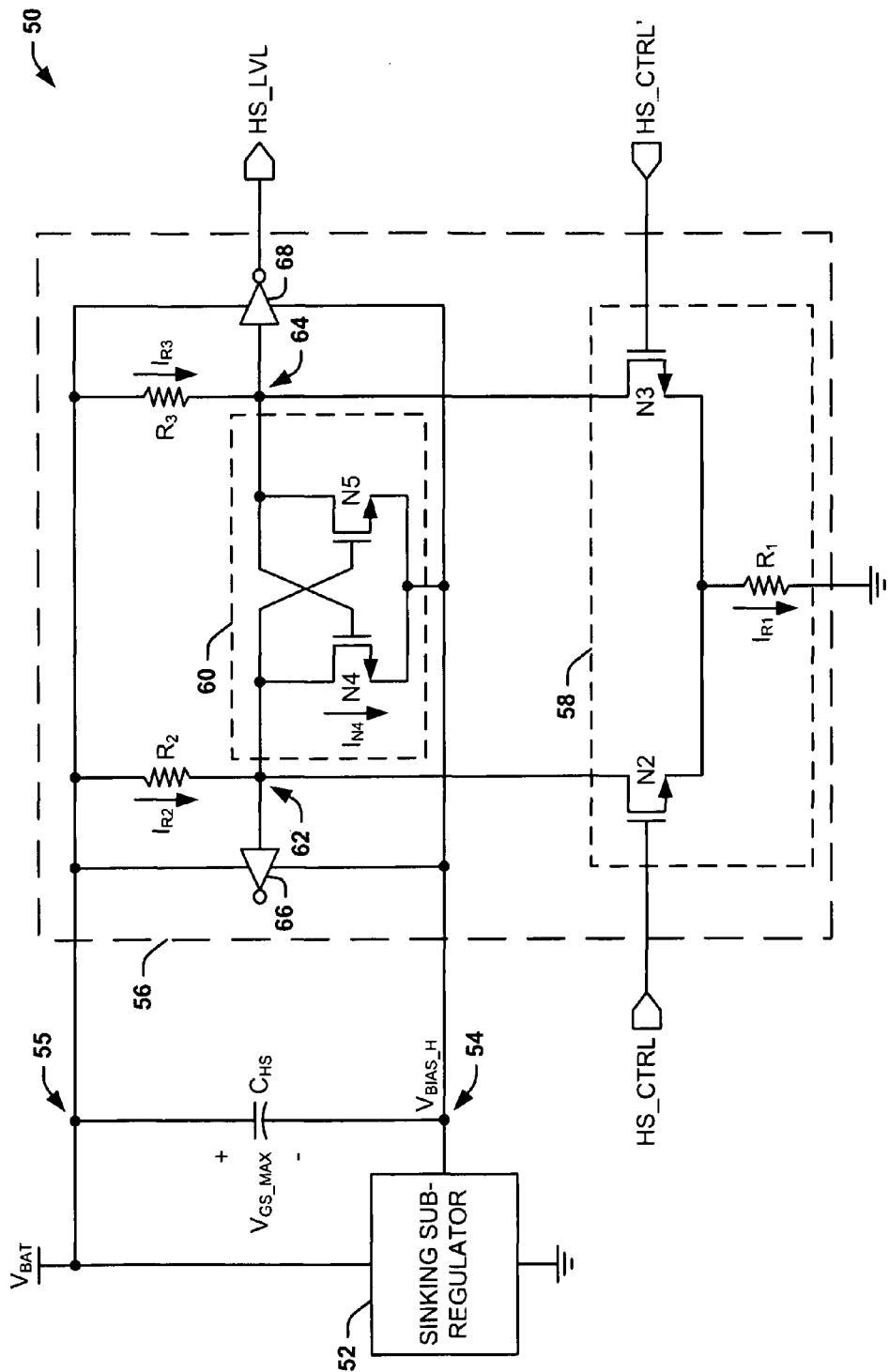
FIG. 2 illustrates an example of a high-side gate driver circuit in accordance with an aspect of the invention.

FIG. 2 illustrates an example of a high-side gate driver circuit 50 in accordance with an aspect of the invention. The high-side gate driver circuit 50 can be the high-side gate driver 16 in the example of FIG. 1. As such, reference is to be made to the example of FIG. 1 in the following description of the example of FIG. 2.

The high-side gate driver circuit 50 includes a sinking sub-regulator 52. The sinking sub-regulator 52 is configured to generate a high-side bias voltage $V_{BIAS\_H}$ at a high voltage domain logic-low rail 54 that is separated from a high voltage domain logic-high rail 55, and thus the battery voltage $V_{BAT}$, by a capacitor $C_{HS}$. As demonstrated in the example of FIG. 2, the capacitor $C_{HS}$ has a voltage $V_{GS\_MAX}$ across it, which can be a maximum desired gate-source activation voltage of the high-side power FET P1. Thus, the high-side bias voltage $V_{BIAS\_H}$ has a magnitude that is approximately equal to the battery voltage $V_{BAT}$ minus the voltage $V_{GS\_MAX}$. The sinking sub-regulator 52 can also be configured to drain a gate capacitance of the high-side power FET P1 through a gate driver to provide rapid activation of the high-side power FET P1 in response to a logic-low state of the high-side switching signal HDRV.

The high-side gate driver circuit 50 also includes a level-shifter circuit 56. The level-shifter circuit 56 includes a control stage 58 and a cross-coupled latch 60. The control stage 58 includes a pair of transistors, demonstrated in the example of FIG. 2 as a first N-FET N2 and a second N-FET N3. As an example, the first and second N-FETs N2 and N3 can be matched FETs, such that they operate substantially independent of process and temperature variations with respect to each other. The first N-FET N2 has a gate that is controlled by the high-side control signal HS_CTRL, a source that is coupled to a resistor $R_1$, and a drain that is coupled to a first control node 62. The second N-FET N3 has a gate that is controlled by a complement of the high-side control signal HS_CTRL', a source that is coupled to the resistor $R_1$, and a drain that is coupled to a second control node 64. Because each of the first N-FET N2 and the second N-FET N3 are controlled by the high-side control signal HS_CTRL and the complement of the high-side control signal HS_CTRL', respectively, the first N-FET N2 and the second N-FET N3 are mutually exclusively activated/deactivated at any given time.

The cross-coupled latch 60 includes another pair of transistors, demonstrated in the example of FIG. 2 as a third N-FET N4 and a fourth N-FET N5. The third N-FET N4 has a source that is coupled to the high voltage domain logic-low rail 54 and a drain that is coupled to both the first control node 62 and a gate of the fourth N-FET N5. The fourth N-FET N5 has a source that is coupled to the high voltage domain logic-low rail 54 and a drain that is coupled to both the second control node 64 and a gate of the third N-FET N4. A resistor $R_2$ separates the first control node 62 from the high voltage domain logic-high rail 55. A resistor $R_3$ likewise separates the second control node 64 from the high voltage domain logic-high rail 55. As an example, the resistors $R_2$ and $R_3$ can each have a resistance magnitude that is approximately equal to a resistance magnitude of the resistor $R_1$.

As described above in the example of FIG. 1, the high-side control signal HS_CTRL and the complement of the high-side control signal HS_CTRL' are each provided in the low voltage domain (e.g., between ground and $V_{GS\_MAX}$). As described above, the first N-FET N2 and the second N-FET N3 are mutually exclusively activated/deactivated at any given time, such that a current $I_{R1}$ substantially constantly flows through the resistor $R_1$. Therefore, the source voltage of the first and second N-FETs N2 and N3 is substantially always approximately equal to $V_{GS\_MAX}$ minus a threshold voltage $V_T$ of the first and second N-FETs N2 and N3. As a result, the current $I_{R1}$ can be expressed as follows:

$$I_{R1}=(V_{GS\_MAX}-V_T)/R_1 \quad\quad\quad \text{Equation 1}$$

Upon the high-side control signal HS_CTRL being asserted (i.e., logic-high), the first N-FET N2 is activated and the second N-FET N3 is deactivated. As a result, a current $I_{R2}$ begins to flow through the resistor $R_2$ and through the first N-FET N2, and a current $I_{R3}$ is halted from flowing through the resistor $R_3$ and the second N-FET N3. Therefore, the current $I_{R1}$ is steered from flowing through the second control node 64 to the first control node 62. Initially, the current $I_{R2}$ has a magnitude that is approximately equal to the current $I_{R1}$. In response, an initial voltage is set at the first control node 62 based on the current $I_{R2}$ and an initial voltage is set at the second control node 64 based on the lack of current $I_{R3}$. Specifically, the initial voltage of the first control node 62 can be approximately equal to the battery voltage $V_{BAT}$ minus the threshold voltage $V_T$ and the initial voltage of the second control node 64 can increase toward the magnitude of the battery voltage $V_{BAT}$.

The high-side gate driver circuit 50 also includes an inverter 66 that is coupled to the first control node 62 and an inverter 68 that is coupled to the second control node 64. Each of the inverters 66 and 68 interconnect the high voltage domain logic-low rail 54 and the high voltage domain logic-high rail 55, and are thus referenced to the high voltage domain. The inverter 68 is configured as a gate driver with respect to the high-side power FET P1. Specifically, the inverter 68 inverts the logic-state at the second control node 64 to provide the level-shifted control signal HS_LVL as an output signal from the level-shifter circuit 56. The inverter 66 is configured as a dummy inverter with respect to the first control node 62, and is thus configured to balance a capacitive load of the level-shifter circuit 56 with respect to the first and second control nodes 62 and 64. The inverters 66 and 68 can have an activation point that is set such that the inverters 66 switch states in response to the initial voltages at the first and second control nodes 62 and 64, respectively. Accordingly, the level-shifted control signal HS_LVL can be provided very rapidly (e.g., less than a nanosecond).

Also in response to the initial voltages of the first and second control nodes 62 and 64, the cross-coupled latch 60 switches states. Specifically, the initial voltage of the second control node 64 increases the gate-source voltage of the N-FET N4 and the initial voltage of the first control node 62 decreases the gate-source voltage of the N-FET N5. Therefore, the N-FET N4 activates to couple the first control node 62 to the high voltage domain logic-low rail 54, thus setting the voltage of the first control node 62 to be approximately equal to the bias voltage $V_{BIAS\_H}$. Similarly, the N-FET N5 deactivates to set the voltage of the second control node 64 to be approximately equal to the battery voltage $V_{BAT}$ based on the lack of current flow through the resistor $R_3$. Accordingly, the first and second control nodes 62 and 64 become latched at opposite logic-states of the high voltage domain.

Upon the cross-coupled latch 60 latching the voltage of the first and second control nodes 62 and 64, the current $I_{R2}$ increases slightly to a magnitude of $(V_{GS\_MAX}/R_3)$. In addition, a small amount of this current $I_{R2}$ flows through the N-FET N4. Specifically, the current $I_{R1}$ remains substantially constant at $(V_{GS\_MAX}-V_T/R_3)$, such that the current $I_{R2}$ is greater than the current $I_{R1}$ by a magnitude of the current $I_{N4}$, which has a magnitude of approximately $(V_T/R_1)$. The current $I_{N4}$ flows into the sinking sub-regulator 52.

Similar to as described above in the example of FIG. 1, the level-shifter circuit 56 provides level-shifting of the high-side control signal HS_CTRL from the low voltage domain to the high voltage domain rapidly. Such rapid level-shifting occurs merely through the steering of the current based on the operation of the control stage 58 to set the initial voltage at the second control node 64, and based on the logic driving of the initial voltage at the second control node 64 via the inverter 68. In addition, the cross-coupled latch 60 latches the high voltage domain logic state at the second control node to ensure stability of the level-shifted control signal HS_LVL.

Figure 3:
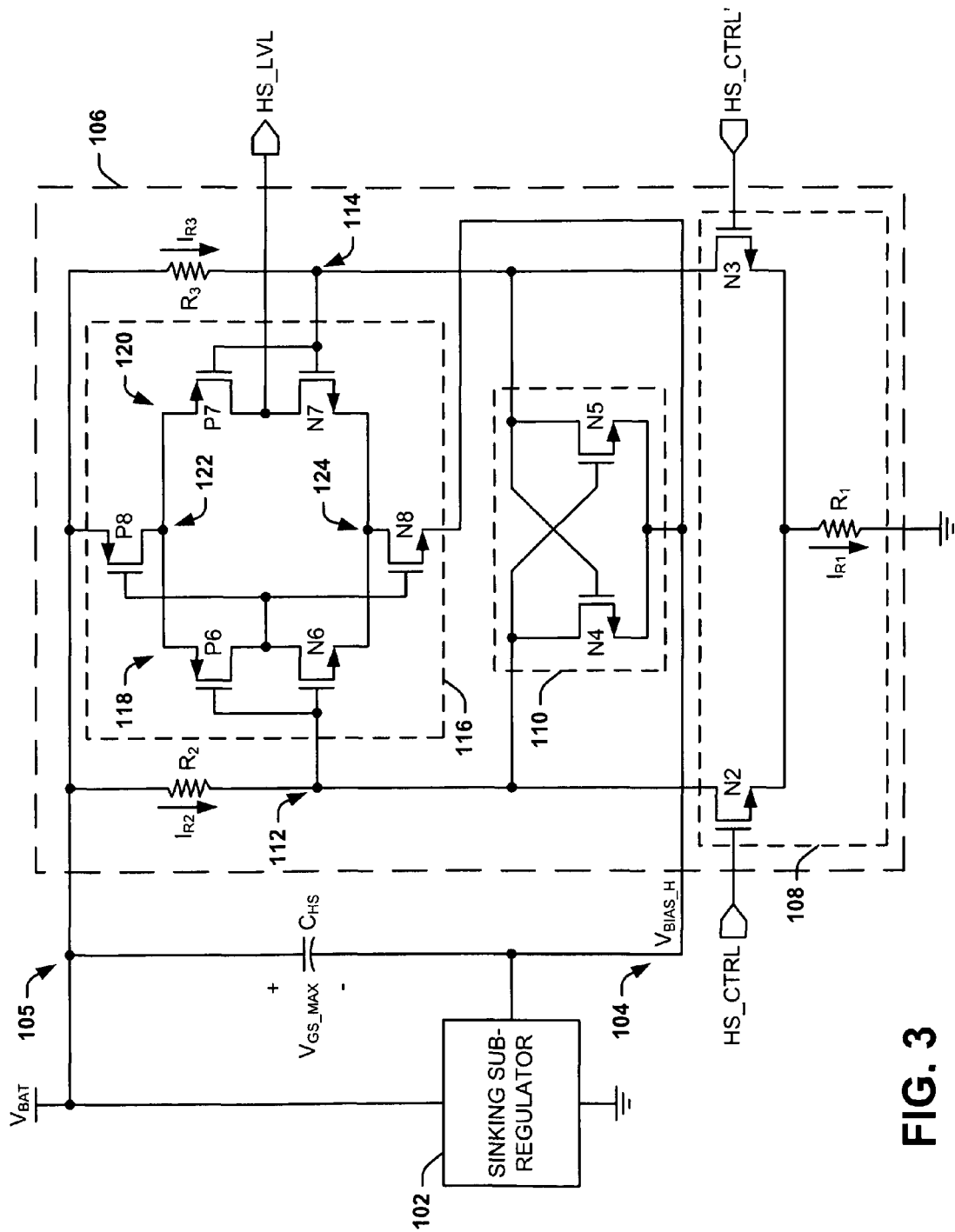
FIG. 3 illustrates another example of a high-side gate driver circuit in accordance with an aspect of the invention.

FIG. 3 illustrates another example of a high-side gate driver circuit 100 in accordance with an aspect of the invention. The high-side gate driver circuit 100 can be the high-side gate driver 16 in the example of FIG. 1. As such, reference is to be made to the example of FIG. 1 in the following description of the example of FIG. 3.

Similar to as described above in the example of FIG. 2, the high-side gate driver circuit 100 includes a sinking sub-regulator 102 configured to generate a high-side bias voltage $V_{BIAS\_H}$ at a high voltage domain logic-low rail 104. The high-side bias voltage is separated from a high voltage domain logic-high rail 105, and thus the battery voltage $V_{BAT}$, by a capacitor $C_{HS}$. The high-side gate driver circuit 100 also includes a level-shifter circuit 106 having a control stage 108 and a cross-coupled latch 110. The control stage 108 and the cross-coupled latch 110 operate substantially the same as the control stage 58 and the cross-coupled latch 60 described above in the example of FIG. 2. Therefore, like identifiers have been used in the description of FIG. 3 as that described above in the example of FIG. 2 for the N-FETs N2, N3, N4, N5 and the resistors $R_1$, $R_2$, and $R_3$ to set the initial and final voltages at a first control node 112 and a second control node 114.

Instead of the inverters 66 and 68 in the level-shifter circuit 56 in the example of FIG. 2, the level-shifter circuit 106 includes a fully-differential inverter 116. The fully-differential inverter 116 includes a first inverter portion 118 that is coupled to the first control node 112 and a second inverter portion 120 that is coupled to the second control node 114. The first inverter portion 118 includes a P-FET P6 and an N-FET N6 and the second inverter portion 120 includes a P-FET P7 and an N-FET N7. Each of the first and second inverter portions 118 and 120 interconnect a node 122 and a node 124, respectively. An output of the second inverter portion 120 provides the level-shifted control signal HS_LVL. An output of the first inverter portion 118 is provided to gates of a P-FET P8 and an N-FET N8. The P-FET P8 interconnects the high voltage domain logic-high rail 105 and the node 122 and the N-FET N8 interconnects the high voltage domain logic-low rail 104 and the node 124.

The fully differential inverter 116 is configured to sense a difference in voltage magnitudes between the first and second control nodes 112 and 114. Specifically, the first and second inverter portions 118 and 120 function substantially similar to the inverters 66 and 68 in the example of FIG. 2, except that the first and second inverter portions 118 and 120 are each referenced to the nodes 122 and 124. The first inverter portion 118 is thus configured to activate one of the P-FET P8 and the N-FET N8 based on the initial voltage at the first control node 112, such that the second inverter portion 120 couples the second control node 114 to the one of the nodes 122 and 124 that is coupled to the respective one of the high voltage domain rails 104 and 105. Accordingly, the first and second inverter portions 118 and 120 cooperate to provide a single-ended output of the fully-differential inverter (i.e., the level-shifted control signal HS_LVL) that is referenced in the high voltage domain. Furthermore, the first and second inverter portions 118 and 120 are symmetrical with respect to each other, thus providing substantially balanced capacitive loading of the first and second control nodes 112 and 114 and mitigating any duty-cycle distortion associated with the cross-coupled latch 110.

The level-shifter circuit 106 in the example of FIG. 3 is therefore another configuration of level-shifter circuit separate from the level-shifter circuit 56 in the example of FIG. 2. Therefore, it is to be understood that the level-shifter circuits 56 and 106 are not limited to the examples of FIGS. 2 and 3, respectively. Specifically, other ways of steering current to set the initial voltages at the control nodes, such that the initial voltages can be inverted or buffered to the high voltage domain are possible in accordance with an aspect of the invention.

Figure 4:
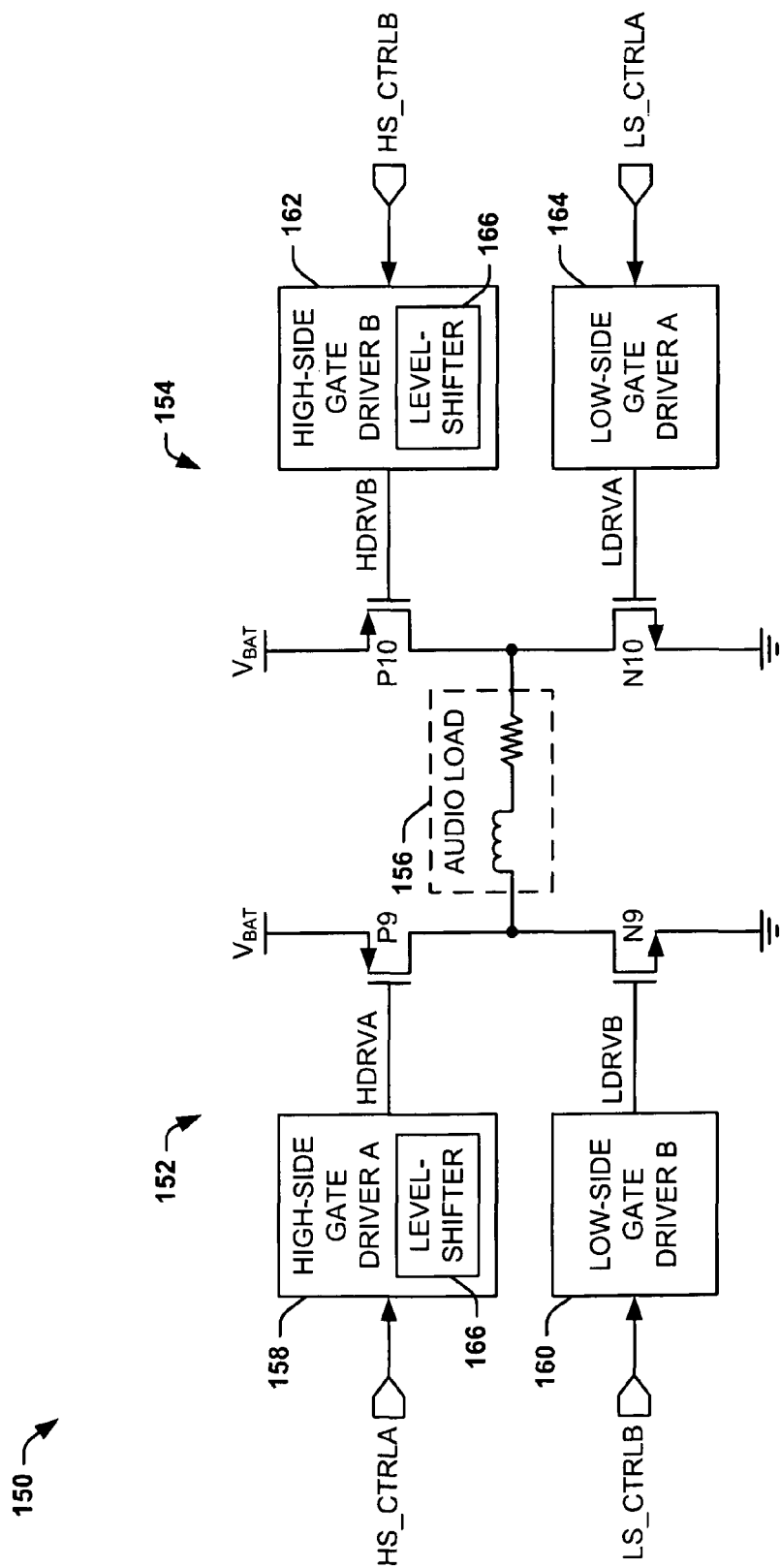
FIG. 4 illustrates an example of an audio amplifier system in accordance with an aspect of the invention.

FIG. 4 illustrates an example of an audio amplifier system 150 in accordance with an aspect of the invention. The audio amplifier system 150 includes a first power stage 152 and a second power stage 154 that are coupled via an audio load 156. As an example, the audio load can be an audio speaker.

The first power stage 152 includes a first high-side gate driver 158 (designated "A") and a first low-side gate driver 160 (designated "B"). Similarly, the second power stage 154 includes a second high-side gate driver 162 (designated "B") and a second low-side gate driver 164 (designated "A"). Each of the first and second high-side gate drivers 158 and 162 can be configured substantially similar to the high-side gate driver 16 in the example of FIG. 1. As demonstrated in the example of FIG. 4, each of the first and second high-side gate drivers 158 and 162 includes a level-shifter 166, which can be configured substantially similar to either of the level-shifter circuit 56 in the example of FIG. 2 or the level-shifter circuit 106 in the example of FIG. 3. Likewise, each of the first and second low-side gate drivers 160 and 164 can be configured substantially similar to the low-side gate driver 18 in the example of FIG. 1.

The first high-side gate driver 158 can generate a switching signal HDRVA to activate a high-side power FET P9 based on a switching duty-cycle of a high-side control signal HS_CTRLA. Similarly, the second high-side gate driver 162 can generate a switching signal HDRVB to activate a high-side power FET P10 based on a switching duty-cycle of a high-side control signal HS_CTRLB. The high-side control signals HS_CTRLA and HS_CTRLB can occupy the low voltage domain, such that the level-shifter 166 in each of the first and second high-side gate drivers 158 and 162 can level-shift the high-side control signals HS_CTRLA and HS_CTRLB to generate the switching signals HDRVA and HDRVB, respectively, in the high voltage domain.

As an example, the level-shifters 166 can include a control stage that is driven by the respective one of the high-side control signals HS_CTRLA and HS_CTRLB to steer a current that sets an initial voltage at each of a pair of respective control nodes. A logic driver can be coupled to one of the control nodes and can be referenced in the high voltage domain. The logic driver can be configured as a single-ended inverter or as a fully-differential inverter. Thus, the logic driver can provide the respective switching signals HDRVA and HDRVB based on the initial voltage at the respective control node. A cross-coupled latch can interconnect the control nodes, and can thus latch the voltage magnitudes of the respective control nodes to opposite states of the high voltage domain based on the initial voltages.

In addition, the first low-side gate driver 160 can generate a switching signal LDRVB to activate a low-side power FET N9 based on a switching duty-cycle of a low-side control signal LS_CTRLB. Similarly, the second low-side gate driver 164 can generate a switching signal LDRVA to activate a low-side power FET N10 based on a switching duty-cycle of a low-side control signal LS_CTRLA. The low-side control signals LS_CTRLA and LS_CTRLB can occupy the low voltage domain to drive the low-side power FETs N9 and N10 in the low power domain.

In the example of FIG. 4, the audio amplifier system 150 is configured as an H-bridge. Specifically, the first and second power stages 152 and 154 can collectively operate to provide a current flow in one of two directions through the audio load 156 based on the switching duty-cycles of the high-side control signals HS_CTRLA and HS_CTRLB as well as the low-side control signals LS_CTRLA and LS_CTRLB. As an example, the switching duty-cycle of the high-side control signal HS_CTRLA can be substantially the same as the switching duty-cycle of the low-side control signal LS_CTRLA. Therefore, the first high-side gate driver 158 and the second low-side gate driver 164 can substantially concurrently activate the high-side power FET P9 and the low-side power FET N10 to provide a current path from the battery voltage $V_{BAT}$ in a first direction through the audio load 156 to ground. Similarly, the switching duty-cycle of the high-side control signal HS_CTRLB can be substantially the same as the switching duty-cycle of the low-side control signal LS_CTRLB. Therefore, the second high-side gate driver 162 and the first low-side gate driver 160 can substantially concurrently activate the high-side power FET P10 and the low-side power FET N9 to provide a current path from the battery voltage $V_{BAT}$ in a second direction through the audio load 156 to ground.

It is to be understood that the audio amplifier system 150 is not limited to the description in the example of FIG. 4. Specifically, the audio amplifier system 150 has been described simplistically, such that a number of components have been omitted. Thus, the example of FIG. 4 merely demonstrates an application of a level-shifter circuit, such as the level-shifter circuits 56 and 106 described in the examples of FIGS. 2 and 3, respectively.

Figure 5:
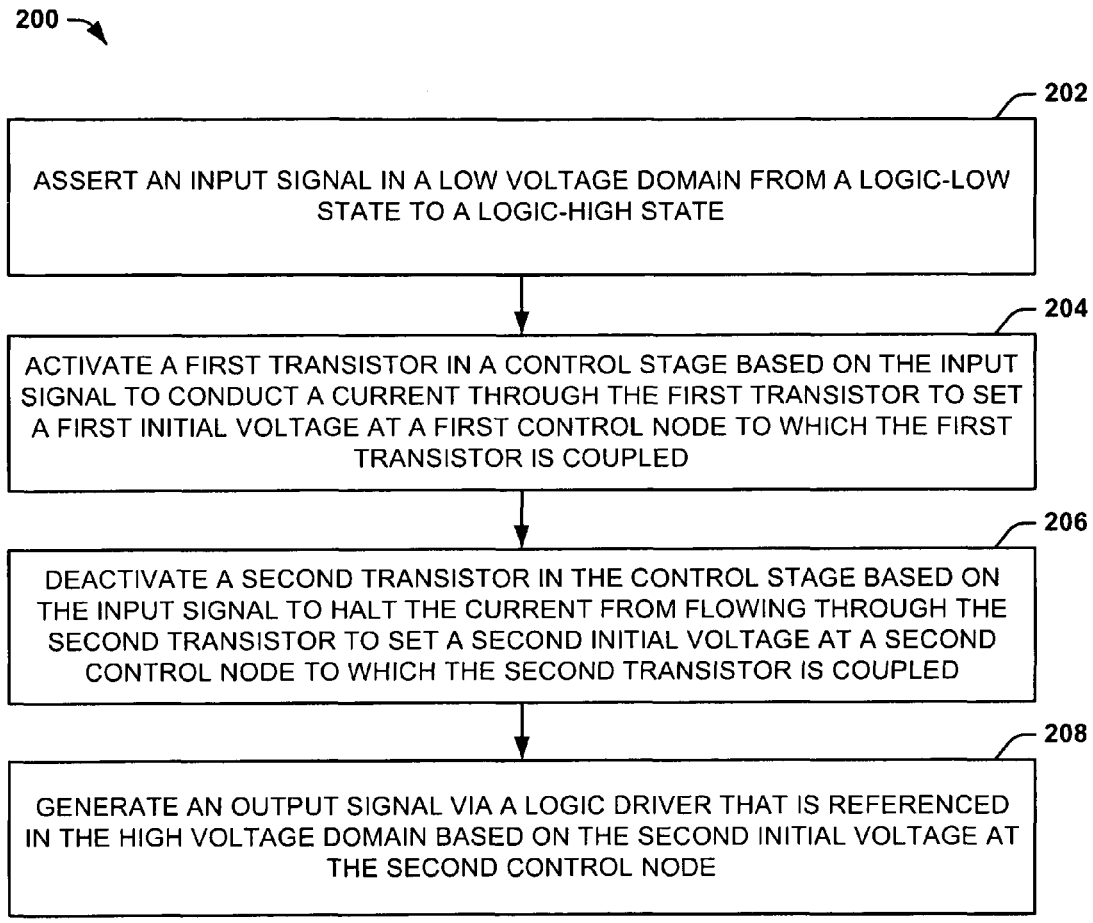
FIG. 5 illustrates an example of a method for level-shifting an input signal in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates an example of a method 200 for level-shifting an input signal in accordance with an aspect of the invention. At 202, an input signal in a low voltage domain is asserted from a logic-low state to a logic-high state. The input signal could be a control signal having a switching duty-cycle that controls a high-side power FET. The low voltage domain could be between zero volts and a desired activation voltage of a power FET. At 204, a first transistor in a control stage is activated based on the input signal to conduct a current through the first transistor to set a first initial voltage at a first control node to which the first transistor is coupled. The current can be drawn from a positive rail, which could be a battery voltage supply. The first initial voltage can thus have a magnitude between the battery voltage and a bias voltage that is less than the battery voltage by the desired activation voltage of the power FET.

At 206, a second transistor in the control stage is deactivated based on the input signal to halt the current from flowing through the second transistor to set a second initial voltage at a second control node to which the second transistor is coupled. The second initial voltage can be greater than the first initial voltage. The current can thus be steered from the second transistor to the first transistor based on the input signal. At 208, an output signal is generated via a logic driver that is referenced in the high voltage domain based on the second initial voltage at the second control node. The logic driver can be an inverter that inverts the output signal to a logic-state that is opposite the input signal, such that the output signal has a magnitude that is approximately equal to the bias voltage.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:
1. A level-shifter circuit comprising:
   a control stage that steers a current from one of a first control node and a second control node to the other of the first control node and the second control node based on an input signal to set a first initial voltage at the first control node and a second initial voltage at the second control node, the input signal having logic-high and logic-low voltage magnitudes that occupy a low voltage domain, wherein the control stage comprises a first transistor that interconnects the first control node and a resistor and is driven by the input signal; and
   a second transistor that interconnects the second control node and the resistor and is driven by a complement of the input signal, wherein the current flows through one of the first and second transistors based on a logic state of the input signal;
   a logic driver that is coupled to the second control node and is referenced in a high voltage domain, the logic driver being configured to provide an output signal having logic-high and logic-low voltage magnitudes that occupy the high voltage domain based on the second initial voltage; and
   further comprising a first resistor that interconnects a high voltage domain logic-high rail and the first control node and a second resistor that interconnects the high voltage domain logic-high rail and the second control node, the first and second resistors having approximately equal resistance magnitudes.

2. The circuit of claim 1, further comprising a cross-coupled latch arranged between the first control node and the second control node, the cross-coupled latch being configured to latch the one of the first and second control nodes at a logic-low state in the high voltage domain and to latch the other of the first and second control nodes at a logic-high state in the high voltage domain based on the relative magnitudes of the first and second initial voltages.

3. The circuit of claim 2, wherein the cross-coupled latch comprises a first transistor and a second transistor, the first transistor having a source coupled to a high voltage domain logic-low rail and a drain coupled to both the first control node and a gate of the second transistor, the second transistor having a source coupled to the high voltage domain logic-low rail and a drain coupled to both the second control node and a gate of the first transistor.

4. A level-shifter circuit comprising:
a control stage that steers a current from one of a first control node and a second control node to the other of the first control node and the second control node based on an input signal to set a first initial voltage at the first control node and a second initial voltage at the second control node, the input signal having logic-high and logic-low voltage magnitudes that occupy a low voltage domain; and
a logic driver that is coupled to the second control node and is referenced in a high voltage domain, the logic driver being configured to provide an output signal having logic-high and logic-low voltage magnitudes that occupy the high voltage domain based on the second initial voltage, wherein the logic driver is configured as an inverter that provides the output signal having an opposite logic-state as the input signal and wherein the inverter is a first inverter, the circuit further comprising a second inverter coupled to the first control node, the second inverter providing a capacitive load of the first control node that is substantially equal to a capacitive load of the second control node based on the first inverter and wherein the inverter is configured as a fully-differential inverter that interconnects the first and second control nodes, the fully-differential inverter comprising:
a first inverter component having an input coupled to the second control node and an output that provides the output signal; and
a second inverter component having an input coupled to the first control node and an output that is coupled to a gate of a first transistor that interconnects a high voltage domain logic-high rail and the first and second inverters and to a gate of a second transistor that interconnects a high voltage domain logic-low rail and the first and second inverters.

5. A half-bridge power stage of a power converter comprising the level-shifter circuit of claim 1.

6. A full-bridge power stage of an audio power amplifier comprising the level-shifter circuit of claim 1.

7. A method for level-shifting an input signal that is in a low voltage domain to provide an output signal that is in a high voltage domain, the method comprising:
asserting the input signal from a logic-low state to a logic-high state;
activating a first transistor in a control stage based on the input signal to conduct a current from a positive rail through the first transistor to set a first initial voltage at a first control node to which the first transistor is coupled;
deactivating a second transistor in the control stage based on the input signal to halt the current from flowing through the second transistor to set a second initial voltage at a second control node to which the second transistor is coupled; and
generating the output signal via a logic driver that is referenced in the high voltage domain based on the second initial voltage at the second control node, wherein generating the output signal comprises generating the output signal via an inverter that is referenced in the high voltage domain based on the second initial voltage at the second control node, such that the output signal has a logic-state that is opposite a logic-state of the input signal; and
further comprising inverting the first control node to set a voltage magnitude of a dummy node approximately equal to the voltage magnitude of the positive rail to substantially balance a capacitive load associated with the first and second control nodes;
setting the first initial voltage of the first control node in response to the current flowing through a first resistor that interconnects the positive rail and the first control node; and
setting the second initial voltage of the second control node in response to deactivating the second transistor to halt a current flow through a second resistor that interconnects the positive voltage rail and the second control node, the first and second resistors having approximately equal resistance magnitudes.

8. The method of claim 7, further comprising switching a cross-coupled latch to set a voltage magnitude at the first control node from the first initial magnitude to a logic-low state of the high voltage domain and to set a voltage magnitude at the second control node from the second initial magnitude to a logic-high state of the high voltage domain.

9. The method of claim 7, further comprising activating a third transistor and deactivating a fourth transistor based on the voltage magnitude of the dummy node, the third transistor being coupled to a high voltage domain logic-low rail and the fourth transistor being coupled to the positive rail to provide the output voltage magnitude as fully-differential based on the voltage magnitudes of the first and second control nodes.

10. The method of claim 7, further comprising:
de-asserting the input signal from a logic-high state to a logic-low state;
activating the second transistor in the control stage based on the input signal to conduct the current from the positive rail through the second transistor to set the first initial voltage at the second control node;
deactivating the first transistor in the control stage based on the input signal to set the second initial voltage at the first control node; and
generating the output signal via the logic driver based on the first initial voltage at the second control node.

11. A high-side gate driver circuit comprising:
means for generating a voltage corresponding to a logic-low signal in a high voltage domain, the voltage having a magnitude that is less than a voltage magnitude of a logic-high signal in the high voltage domain by a maximum activation voltage of a high-side power transistor; and
means for level-shifting an input signal from a low voltage domain to the high voltage domain, the means for level-shifting comprising:
means for steering a current from a positive rail through one of a first control node and a second control node based on the input signal;

means for setting a first initial voltage at the first control node and for setting a second initial voltage at the second control node based on the current, each of the first and second initial voltages being between the logic-low signal and the logic-high signal in the high voltage domain; and means for generating an output signal in the high voltage domain based on the second initial voltage at the second control node.

12. The circuit of claim 11, wherein the means for generating the output signal is configured as a means for driving the second initial voltage of the second control node between the logic-low signal and the logic-high signal in the high voltage domain in an opposite logic state of the input signal.

13. The circuit of claim 12, wherein the means for driving the second initial voltage is configured as a fully-differential inverter coupled between the first and second control nodes.

* * * * *